(12) United States Patent
Almuneau et al.

(10) Patent No.: US 7,932,160 B2
(45) Date of Patent: Apr. 26, 2011

(54) PLANAR OXIDATION METHOD FOR PRODUCING A LOCALISED BURIED INSULATOR

(75) Inventors: Guilhem Almuneau, Montlaur (FR); Antonio Munoz-Yague, Toulouse (FR); Thierry Camps, Toulouse (FR); Chantal Fontaine, Toulouse (FR); Véronique Bardinal-Delagnes, Castelmaurou (FR)

(73) Assignee: Centre National de la Recherche Scientifique (CNRS), Paris (FR)

( * ) Notice: Subject to any disclaimer, the term of this patent is extended or adjusted under 35 U.S.C. 154(b) by 742 days.

(21) Appl. No.: 11/883,706

(22) PCT Filed: Feb. 2, 2006

(86) PCT No.: PCT/FR2006/000242
§ 371 (c)(1),
(2), (4) Date: Aug. 3, 2007

(87) PCT Pub. No.: WO2006/082322
PCT Pub. Date: Aug. 10, 2006

(65) Prior Publication Data
US 2008/0164560 A1    Jul. 10, 2008

(30) Foreign Application Priority Data
Feb. 7, 2005    (FR) ...................................... 05 01201

(51) Int. Cl.
*H01L 21/76* (2006.01)

(52) U.S. Cl. .............. 438/442; 438/22; 438/42; 438/46; 438/48; 257/22; 257/506; 257/773; 257/E21.286

(58) Field of Classification Search ..................... 257/22, 257/506, 773, E29.001, E21.285, E21.286, 257/E21.542; 438/22, 42, 46, 48, 442; 372/45.01, 372/46.01

See application file for complete search history.

(56) References Cited

U.S. PATENT DOCUMENTS

| | | | |
|---|---|---|---|
| 5,312,518 A * | 5/1994 | Kadomura | 438/723 |
| 5,896,408 A * | 4/1999 | Corzine et al. | 372/46.013 |
| 6,545,335 B1 | 4/2003 | Chua et al. | |
| 7,208,770 B2 * | 4/2007 | Kish et al. | 257/96 |
| 2002/0182823 A1 * | 12/2002 | Yokouchi et al. | 438/410 |
| 2003/0067009 A1 * | 4/2003 | Chua et al. | 257/84 |
| 2003/0211642 A1 | 11/2003 | Nohava et al. | |
| 2004/0264531 A1 | 12/2004 | Ryou et al. | |

FOREIGN PATENT DOCUMENTS

| | | |
|---|---|---|
| EP | 0 858 137 B1 | 8/1998 |
| EP | 1 049 221 A1 | 11/2000 |

* cited by examiner

*Primary Examiner* — Matthew C Landau
*Assistant Examiner* — Colleen E Snow
(74) *Attorney, Agent, or Firm* — Foley & Lardner LLP

(57) ABSTRACT

The invention relates to a method of producing a semiconductor device, comprising the following steps consisting in: forming first, second and third semiconductor layers (1, 2, 3), whereby the first and second layers (1, 3) contain a smaller concentration of oxidizable species than the second layer (2); forming a mask (4) on the third layer (3); and oxidizing the second layer (2) with the diffusion of oxidizing species through the third layer (3).

11 Claims, 3 Drawing Sheets

FIG.2.
(PRIOR ART)
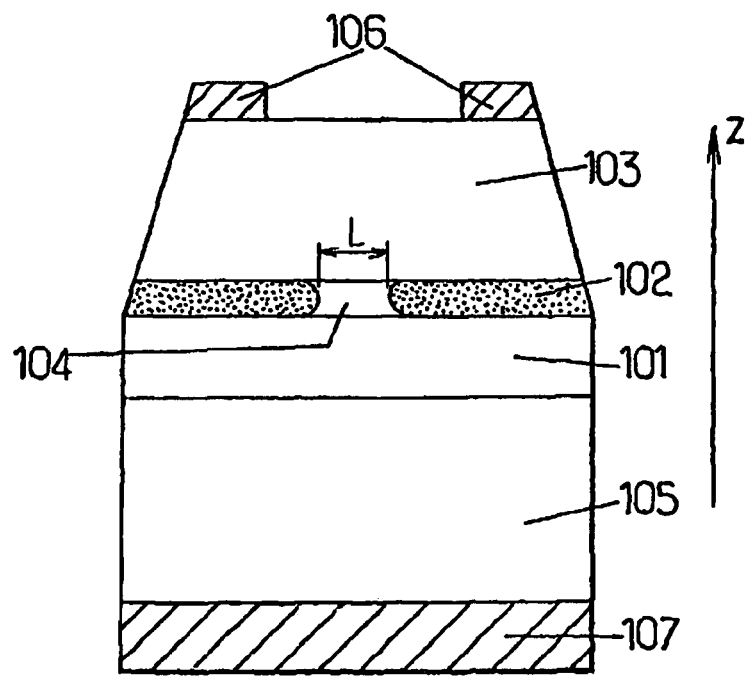
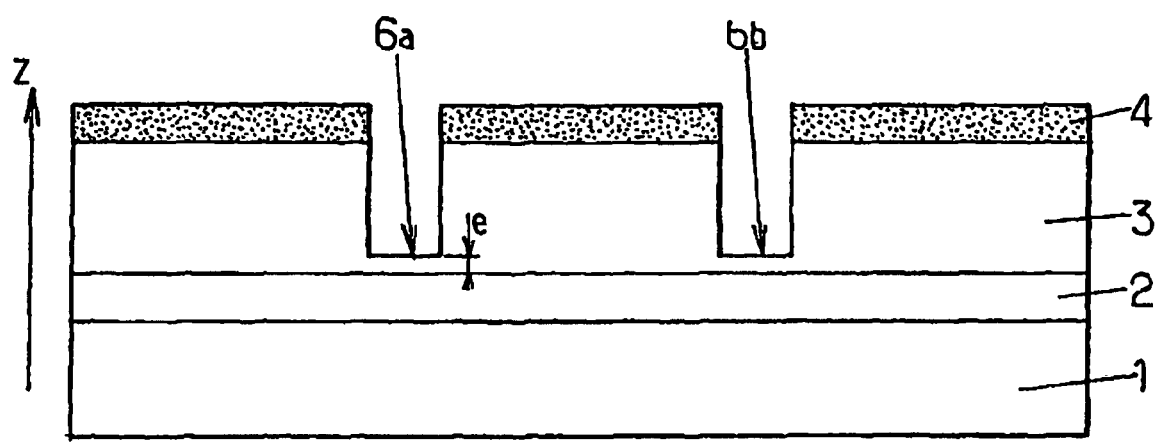
FIG.8.

PLANAR OXIDATION METHOD FOR PRODUCING A LOCALISED BURIED INSULATOR

CROSS REFERENCE TO RELATED APPLICATIONS

This application is a National Stage application of PCT/FR2006/000242, filed Feb. 2, 2006, which claims priority from French patent application FR 0501201, filed Feb. 7, 2005.

This present invention relates to planar oxidation methods for producing a localised buried insulator, in particular for type IIIV semiconductors, according to the Mendeleev periodic element classification.

More particularly, the invention concerns a process for the manufacture of a semiconductor that is, suitable for microelectronics, optoelectronics, and integrated optics for example, concerning waveguides, diffraction networks and photonic crystals.

A method for the lateral oxidation of a semiconductor is illustrated in particular in FIG. 1. In this process, we form a first semiconductor layer 101. Then we form a second semiconductor layer 102, and a third layer 103 on the second layer. We give to these last two layers 102 and 103 the shape of a "mesa" or flat-topped hill, that is that shape of a portion projecting from the top surface of the first layer 101. This shape can be obtained by photo-engraving or photo-etching of the semiconductor component for example. We can then proceed to a lateral oxidation by diffusing oxidising species through a lateral surface of this mesa. These oxidising species will selectively oxidise the second layer over a length Lox, as a function of the diffusion of the oxidising species, and therefore in particular of the exposure time and conditions (temperature, flow and nature of the gas). The central part of the second layer 104 can remain non-oxidised, depending on the application.

For example, it is possible to use this type of oxidation process during the manufacture of Vertical Cavity Surface Emitting Lasers or VCSELs, as illustrated in FIG. 2. In order to emit laser radiation in direction Z, a VCSEL includes a cavity laser 101, of thickness $\lambda/n$ for example, where n is the refraction index and $\lambda$ is a radiation wavelength. The layers 103 and 105 form Bragg mirrors on each side of the cavity 101. These layers in fact consist of a stack of quarter-wave layers, alternately with a high refraction index and a low refraction index. The oxidised portions of layer 102, formed by lateral oxidation, form a diaphragm which is used firstly to impose the path of the electric current between the top metal depositions 106 and a bottom metal deposition 107, through the central portion 104. Secondly, this diaphragm is used to limit the possible lateral modes of laser emission, so that the laser radiation is quasi monochromatic. However, this diaphragm must not excessively limit the emission power. As a consequence, it is desired to have a good control of the length L of the central portion 104.

However, given that the distance L is relatively small in relation to the length $L_{ox}$ that has to be covered by the oxidising species, there exists a large degree of imprecision in the control of this length L, and therefore imprecision in the optoelectronic performance of the component. As a consequence, reproducibility is rendered difficult. Moreover, this process limits the possible applications.

Apart from this, the formation of the "mesa" is quite difficult, preventing the top layer 103 from being flat, limiting any epitaxial growth, that is the take of the growth of a crystal in order to form a top layer. Thus, it is very difficult to produce multi-layer components or to integrate these components with other components. Finally, this process is difficult to reproduce, and high-precision performance in the oxidation patterns and in an industrial process are limited.

This present invention has the particular objective of overcoming these drawbacks.

More specifically, the invention has as its purpose to provide a manufacturing process that will result in greater precision in the oxidation patterns and better definition of the oxidised layers.

In addition, the invention has as its purpose to provide a process that will enable improved industrialisation. To this end, according to a currently accepted definition of the invention, a process of the type in question is characterised in that it includes the following stages for:

(a) formation of a first semiconductor layer;
(b) formation of a second semiconductor layer on top of the first semiconductor layer, in formation direction Z, with a concentration of species capable of being oxidised in the first layer being considerably lower than a concentration of species capable of being oxidised in the second layer;
(c) formation of a third semiconductor layer on top of the second semiconductor layer, in formation direction Z, with a concentration of species capable of being oxidised in the third layer being considerably lower than the concentration of species capable of being oxidised in the second layer;
(d) formation at least one diffusion zone on the third layer;
(e) oxidation of the second layer by diffusion of oxidising species through the diffusion zone of the third layer.

By virtue of these arrangements, the invention is able to provide a method for the manufacture of a totally planar semiconductor device. As a consequence, it is possible to produce epitaxial growth on the top layer of the electronic component to form a multi-layer component. Moreover, because of the reduced thickness of material to cross in order to form the layer, this process results in a higher speed of production of components and a greater precision in the length of the non-oxidised zones. Finally, this oxidation enables one to envisage complex patterns that are not accessible to processes of the mesa type, and can be effected by means of masks. In addition, it is possible to produce components such as integrated optical waveguides, or any other optical structure that is periodic or not, taking advantage of the contrast of refraction index between the oxidised and non-oxidised layers.

In various methods of implementation of the process of the invention, it is also possible to resort to any of the following arrangements:

In the course of stage (c), we form the third layer so that its thickness in formation direction Z, at least in the diffusion zone, is between 5 and 100 nm;
stage (d) includes the formation of a mask, effected by lithography, followed by etching of the mask in the neighborhood of the said diffusion zone;
stage (d) is effected by etching of the third layer at least at the level of the diffusion zone, over a predetermined depth in formation direction Z, that is less than the thickness of the said third layer in the formation direction;
stage (e) is effected under an atmosphere that includes a mixture of a vector gas and water vapour;
the vector gas includes at least one of the following gases: hydrogen, nitrogen, argon, nitrogen hydrogen;
stage (e) is effected at a temperature of more than 300° C.;
the process also includes stages that consist of:
(f) the formation of a fourth layer;

(g) the formation of a fifth layer on the fourth layer, in formation direction Z, a concentration of species capable of being oxidised in the fourth layer being considerably lower than a concentration of species capable of being oxidised in the fifth layer, with stages (f) and (g) being effected prior to stage (a), with the first layer being formed on the fifth layer in the course of stage (a) in formation direction Z;

the process also includes a stage (h) of attack on the rest of the mask in the third layer;

the process also includes a stage (i) consisting of the epitaxial growth in the third layer;

the semiconductor is a type III-V semiconductor, according to the Mendeleev periodic element classification.

In addition, the invention also includes as its subject a semiconductor that can be obtained by the implementation of the process according to the invention.

Other characteristics and advantages of the invention will appear in the course of the following description of one of its methods of implementation, which is provided by way of a non-limiting example, with reference to the appended drawings, in which:

FIG. 1, already described, represents a method for the manufacture of a semiconductor device according to prior art methods;

FIG. 2, already described, represents a VCSEL;

FIG. 8 illustrates a semiconductor device in the course of manufacture according to a first variant of a process according to the invention;

In these various figures, the same references refer to elements that are identical or similar.

Figure 1:
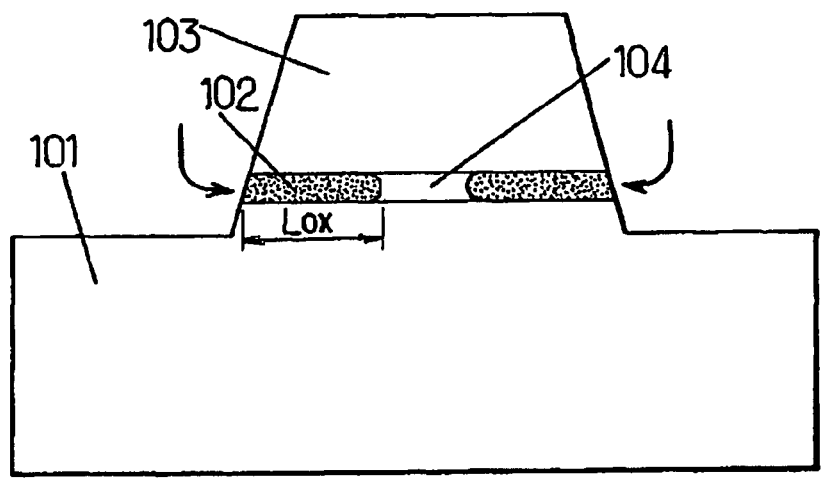
Figure 3:
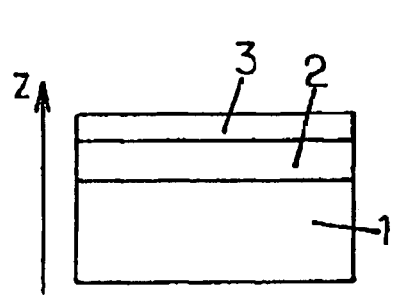
FIG. 3 illustrates a semiconductor device in the course of manufacture using a process according to the invention.

As shown in FIG. 3, in order to form a semiconductor component according to the invention, we produce a superimposition of three semiconducting layers (1, 2 and 3), in this order in direction Z, by epitaxy, on top of each other. By "layer" is meant either a layer or a collection of sub-layers. For example, the first layer 1 is the bottom layer, and on this layer we form a second layer 2. While the first layer 1 can be composed mostly of gallium arsenide (GaAs) or of gallium arsenide with a low aluminium content (AlGaAs with less than 70% aluminium), the second layer 2 is rich in species capable of being oxidised, which here is the aluminium. For example, the second layer can be formed mostly of aluminium arsenide (AlAs) or gallium arsenide with a high aluminium content (AlGaAs with more than 70% aluminium). Like the first layer, the third layer 3 can have very few species capable of being oxidised, and can be formed of GaAs, or of AlGaAs with a low aluminium content.

It is possible however to transpose this process for semiconductors other than type III-V semiconductors, according to the Mendeleev periodic element classification. For example, for semiconductors of the IV-IV type, it is possible to use Ge(Si) for the first and third layers, and Si for the second layer, with the species capable of being oxidised being the Si. Likewise, it is possible to transpose this oxidation process for semiconductors of the II-VI type.

Figure 4:
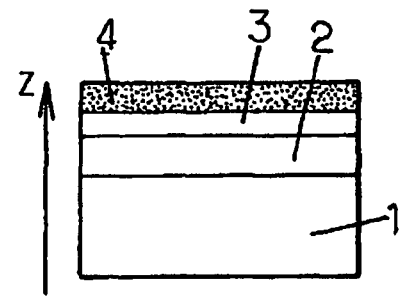
FIG. 4 illustrates a semiconductor device in the course of manufacture using a process according to the invention.

Then, in order to produce a wanted pattern, we use a lithography and etching process, for example. Thus, as illustrated in FIG. 4, it is possible to deposit a masking material 4 on the top surface in direction Z, here on the third layer 3 for example. This masking material 4 can be deposited on the third layer 3 by chemical deposition in the vapour phase, by Plasma Enhanced Chemical Vapour Deposition or PECVD for example, or by centrifuging. This material 4 can include a dielectric for example, like SiNx or SiO2, or the SrF2.

Figure 5:
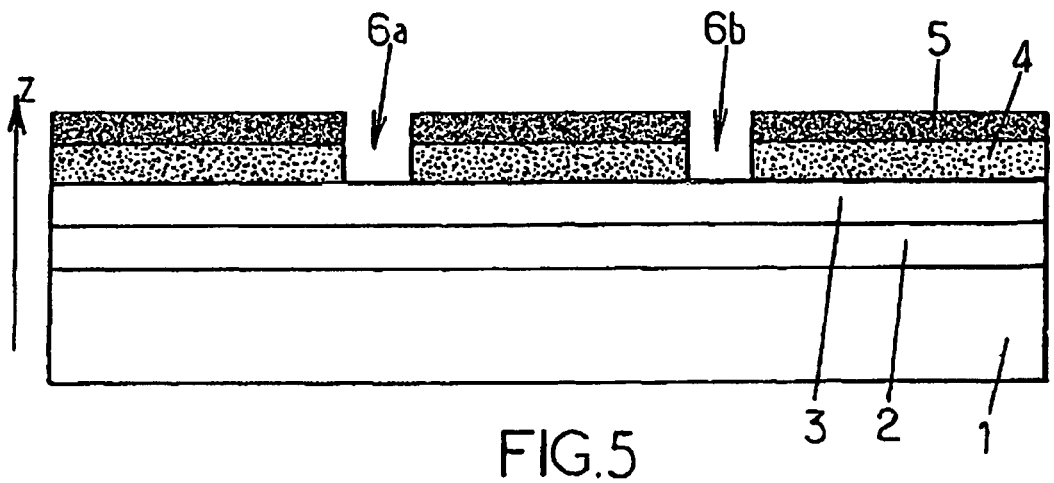
FIG. 5 illustrates a semiconductor device in the course of manufacture using a process according to the invention.

When the masking material 4 has been deposited, a photosensitive layer 5, illustrated in FIG. 5, is deposited. Then we expose this photosensitive layer 5 to ultraviolet radiation for example, in the desired pattern. Thus, the photosensitive layer 5 can be at least partially modified and can be developed wherever it has been exposed. After development, it is then possible to produce openings 6a and 6b by etching (using the dry or wet method) of the masking material 4.

It is thus easily possible to form a mask with the desired shape to then produce the semiconductor component. The semiconductor material can then be oxidised according to the shape of this mask.

Figure 6:
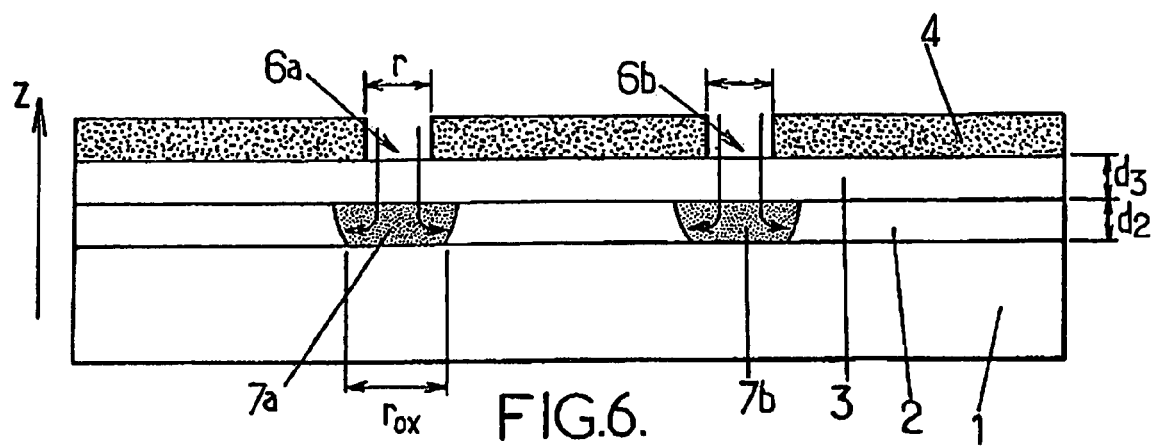
FIG. 6 illustrates a semiconductor device in the course of manufacture using a process according to the invention.

As illustrated in FIG. 6, we then effect the oxidation of the second layer 2 through the third layer 3. To this end, we place the semiconductor device in an oven at a temperature of more than 300° C. for AlGaAs, and preferably in the neighborhood of 400° C., for a time of between 2 and 10 minutes, and in an atmosphere that includes a mixture of oxidising species, such as nitrogen hydrogen loaded with water vapour for example. In the case of a semiconductor using InP, a temperature of 500° C. is preferred, for example.

In these conditions, the oxidising species will diffuse through the third layer 3 without oxidising it, since the latter has little or no species capable of being oxidised at this temperature. On reaching the second layer 2, which is rich in species capable of being oxidised at this temperature, the oxidising species will react to form insulating oxide islets 7a and 7b.

In order to facilitate the diffusion of the oxidising species through layer 3, it is preferable that the latter should be of relatively low thickness d3 in direction Z, of between 10 and 50 nm, while the thickness d2 in direction Z is greater than 20 nm, and typically between 20 and 100 nm for the VCSELs. This guarantees good diffusion through the third layer 3 and good oxidation of the second layer 2.

Figure 7:
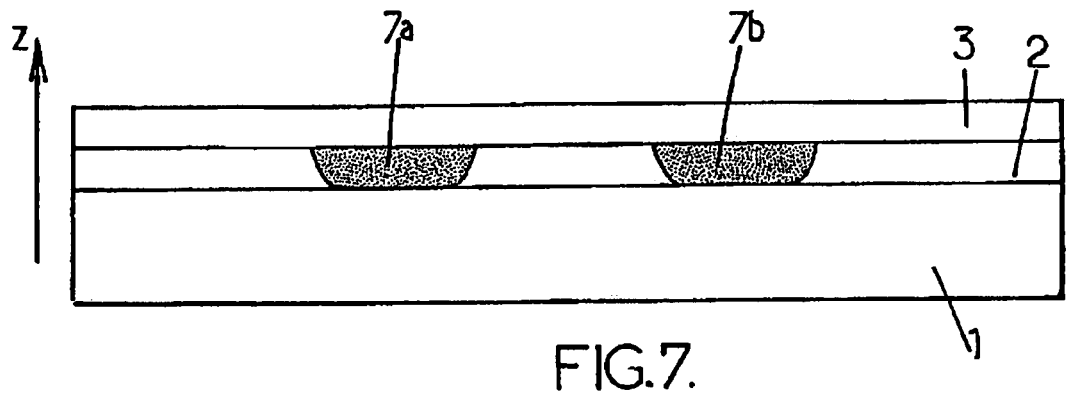
FIG. 7 illustrates a semiconductor device after manufacture using a process according to the invention.
Figure 9:
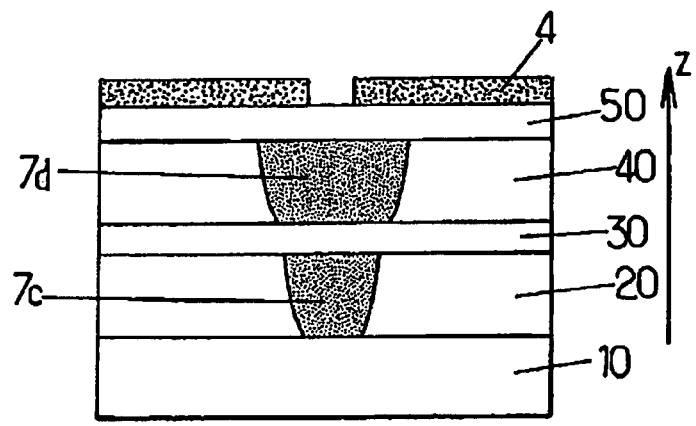
FIG. 9 illustrates a semiconductor device in the course of manufacture according to a second variant of manufacture.

One the oxidised portion has been formed, it is then possible to completely remove the mask 4, as illustrated in FIG. 7. It is the possible to form an additional layer on top of the third layer, by epitaxy for example. It is thus possible to produce complex multi-layer components.

According to an implementation variant represented in FIG. 8, it is possible to form the third layer 3 with a greater thickness in formation direction Z, of 200 nm, for example. Next, we produce a mask 4 on the third layer 3 and we attack this layer 3 over a given depth to form pits 6a and 6b. The bottom of the pits 6a and 6b form diffusion zones. The thickness e of the third layer at the level of the diffusion zone is quite low, in order to allow the diffusion of the oxidising species through the third layer 3, for 20 nm for example, while the thickness of the third layer 3 in the places not attacked is 200 nm and does not allow diffusion through it. The mask 4 is then removed, and oxidisation takes place in an identical manner to the preceding method of implementation.

This variant allows us to avoid placing the mask in the oven. In fact, if this mask is subjected to a high temperature, it then becomes difficult to remove, and the surface of the third layer 3 could be damaged. As a consequence, using this variant, epitaxial growth on the third layer 3 is simplified.

It has been noted that during the implementation of this process according to one of the variants described above, the oxidised islets 7a and 7b spread slightly across formation direction Z. Thus, the width $r_{ox}$ of the oxidised portion 7a or 7b in this direction Z is greater than the width r of the opening in the mask 6a or 6b. Moreover, the width $r_{ox}$ increases as the oxidation time increases or as the concentration in oxidising species in the atmosphere increases. Thus, it is possible to control passage outside of these oxidised islets 7a and 7b by adjusting the thickness of the layer to be oxidised, or the time, or the temperature or indeed the concentration of the oxidising species. It is also possible to allow for these phenomena during the design stage and to adapt the pattern of the mask as a function of these unwanted effects.

Moreover, it is possible to play with the shape of these unwanted processes, by modifying the concentration profile of species capable of being oxidised in the layer to be oxidised for example.

According to another method of implementation illustrated in FIG. 8, it is possible to oxidise a multiplicity of superimposed layers simultaneously. Thus, the semiconductor component can consist of five or more layers. Layers 10, 20, 30, 40 and 50, can be formed as before, by epitaxy, in this order for example. In a manner comparable to the preceding method of implementation, layers 30 and 50 do not include species capable of being oxidised, unlike layer 40. Likewise, layer 20 has a high concentration in species capable of being oxidised. Layer 10 has no species capable of being oxidised.

In a manner similar to the first implementation variant, we form a mask 4 above the top layer 50, and we then proceed to the oxidation process. By diffusion through layer 50, the oxidising species oxidise layer 40 to form oxidised portion 7d, without oxidising layer 50. However, the latter can then diffuser through layer 30 without oxidising it, and then oxidises layer 20 to form layer 7c.

As a consequence, in a single oxidation, we proceed to the formation of a multiplicity of superimposed oxidised islets. In order to achieve this multiple oxidation, it is preferable that layers 30 and 50 through which the oxidising species pass, should be of low thickness. Moreover, the width of the oxidised portion 7c is less than the width of the oxidised portion 7d.

However, it is possible to adapt the concentrations, or the thickness of the second and fourth layers 20 and 40, in order to modify the width, the shape and the extent of the oxidised islets 7c and 7d. In fact, as the thickness of the layer to be oxidised reduces, then the more the stray effects are reduced, since the oxidising species have greater difficulty in diffusing.

The end of the manufacturing process according to this variant is identical to the process prior described previously.

The invention claimed is:

1. A process for the manufacture of a semiconductor comprising the steps of:
   (a) formation of a first semiconductor layer;
   (b) formation of a second semiconductor layer above the first semiconductor layer, according to a direction of formation Z, a concentration of species capable of being oxidised in the first layer being substantially weaker than a concentration of species capable of being oxidised in the second layer;
   (c) formation of a third semiconductor layer above the second semiconductor layer according to the direction of formation Z, a concentration of species capable of being oxidised in the third layer being substantially weaker than the concentration of species capable of being oxidised in the second layer;
   (d) formation of at least one diffusion zone on the third layer;
   (e1) diffusion of oxidising species in the material of the third layer according to a general direction of diffusion parallel to the direction of formation,
   (e2) oxidation of the second layer by diffusion of oxidising species through the third layer,
   wherein stage (d) is achieved by etching of the third layer at least at the level of the diffusion zone, over a predetermined depth in formation direction Z that is less than the thickness of the said third layer in the formation direction.

2. The process of claim 1, in which during step (c), the third layer is formed such that its thickness according to said formation direction Z at least at the level of the diffusion zone is between 5 and 100 nm.

3. The process of claim 1, in which stage (d) includes the formation of a mask, produced by lithography followed by etching of the mask in the neighbourhood of said diffusion zone.

4. The process of claim 3, further comprising a stage (h) for attacking the rest of the mask in the third layer.

5. The process of claim 1, in which stage (e) is effected in an atmosphere that includes a mixture of a vector gas and water vapour.

6. The process of claim 5, in which the vector gas includes at least one of the following gases: hydrogen, nitrogen, argon, nitrogen hydrogen.

7. The process of claim 1, in which stage (e) is effected at a temperature of more than 300° C.

8. The process of claim 1, further comprising the steps of:
   (f) the formation of a fourth layer;
   (g) the formation of a fifth layer on the fourth layer, in formation direction Z, with a concentration of species capable of being oxidised in the fourth layer being considerably lower than a concentration of species capable of being oxidised in the fifth layer;
   with stages (f) and (g) being effected prior to stage (a), the first layer being formed on the fifth layer in the course of stage (a) in formation direction Z.

9. The process of claim 1, further comprising a stage (i) consisting of an epitaxy on the third layer.

10. The process of claim 1, in which the semiconductor is a type III-V semiconductor, according to the Mendeleev periodic element classification.

11. A semiconductor created by implementation of the process according to claim 1.

* * * * *